United States Patent [19]
Komatsuzaki et al.

[11] Patent Number: 5,754,432
[45] Date of Patent: May 19, 1998

[54] APPARATUS AND METHOD FOR ESTIMATING CHIP YIELD

[75] Inventors: Takao Komatsuzaki, Ishioka; Yoichi Miyai, Toride; Hideyuki Fukuhara, Ami-machi, all of Japan

[73] Assignee: Texas Instruments Incorporated, Dallas, Tex.

[21] Appl. No.: 568,909

[22] Filed: Dec. 7, 1995

[30] Foreign Application Priority Data

Dec. 9, 1994 [JP] Japan .................. 6-306035

[51] Int. Cl.$^6$ .................................................. G06F 19/00
[52] U.S. Cl. .................... 364/468.17; 364/468.28; 364/552; 364/578; 364/490
[58] Field of Search .................... 364/552, 554, 364/578, 551.01, 550, 468.15, 468.16, 468.17, 468.28, 488, 489, 490

[56] References Cited

U.S. PATENT DOCUMENTS

| | | | |
|---|---|---|---|
| 3,751,647 | 8/1973 | Maeder et al. | 364/552 |
| 3,983,479 | 9/1976 | Lee et al. | 324/537 |
| 4,481,664 | 11/1984 | Linger et al. | 364/489 |
| 4,763,289 | 8/1988 | Barzilai et al. | 364/578 |
| 4,835,466 | 5/1989 | Maly et al. | 324/537 |
| 5,051,938 | 9/1991 | Hyduke | 364/578 |
| 5,282,140 | 1/1994 | Tazawa et al. | 364/578 |
| 5,287,290 | 2/1994 | Tabara et al. | 364/489 |
| 5,438,527 | 8/1995 | Feldbaumer et al. | 364/578 |
| 5,497,381 | 3/1996 | O'Donoghue et al. | 371/28 |
| 5,539,652 | 7/1996 | Tegethoff | 364/578 |
| 5,598,341 | 1/1997 | Ling et al. | 364/468.17 |
| 5,649,169 | 7/1997 | Berezin et al. | 364/468.17 |

OTHER PUBLICATIONS

James A. Cunningham, "The Use and Evaluation of Yield Models in Integrated Circuit Manufacturing", IEEE Trans. on Semiconductor Manufacturing, vol. 3, No. 2, May 1990, pp. 60–71.

Duvivier et al., "Approximation of Critical Area of ICs with Simple Parameters Extracted from the Layout", Proc. of the IEEE Intnl. Workshop on Defect and Fault Tolerance in VLSI Systems, Nov. 1995, pp. 1–9.

Shahsavari et al., "IC Yield Modeling and Statistical Circuit Simulation", Southcon/94 Conf. Record, Mar. 1994, pp. 594–598.

Dance et al., "Estimating Semiconductor Yield from Equipment Particle Measurements", IEEE/SEMI International Semiconductor Manufacturing Science Symposium, Jun. 1992, pp. 18–23.

Lewis Hecht, "A New Method to Determine Contamination Limited Yield", IEEE Trans. on Components, Hybrids, and Manufacturing Technology, vol. 14, No. 4, Dec. 1991, pp. 904–905.

(List continued on next page.)

*Primary Examiner*—Ellis B. Ramirez
*Assistant Examiner*—Eric W. Stamber
*Attorney, Agent, or Firm*—Richard L. Donaldson; Gerald E. Laws

[57] ABSTRACT

A high speed device and method for estimating the yield of semiconductor chips without requiring a large data storage area. The noise particles which adhere to a number of semiconductor chips are generated in a particle generating unit 12 and an identification number indicating the semiconductor chip on which the noise particles adhere is given. All the noise particles are driven in driving unit 13 on one mask stored in circuit storage unit 15. The mask pattern near the driven noise particle is checked and whether or not the noise particle causes a defect is checked in a defect detecting unit 16. Semiconductor chips with defects are detected in a semiconductor chip defect detecting unit 17 based on the semiconductor chip identification number of each noise particle. Then a computing unit 18 calculates the chip yield from the total number of semiconductor chips and the number of semiconductor chips without defects.

9 Claims, 4 Drawing Sheets

OTHER PUBLICATIONS

IEICE Transactions on Electronics, vol. E87–C, No. 7, Jul. 1995, Japan, pp. 852–857, XP002020369 Fukuhara H; Komatsuzaki T; Boku K; Miyai Y: "Use of a Monte Carlo wiring Yield simulator to optimize design of random logic circuits for yield enhancement" p. 853, right–hand column, paragraph 3, p. 854, right–hand column, paragraph 2.

Patent Abstracts of Japan, vol. 95, No. 011 & JP-A-07 306848 (Matsushita Electron Corp) , Nov. 21, 1995, abstract.

Proceedings of the International conference on Microelectronic Test Structures (ICMTS) , San Diego, Mar. 22–25, 1994, Mar. 22, 1994, Institute of Electrical and Electronics Engineers, pp. 98–107, XP000481297 Jitendra Khare et al: "Sram–Based Extraction of Defect Characteristics" figures 3,5.

| PARTICLE NUMBER | CHIP NUMBER | POSITION COORDINATES | | PARTICLE SIZE |
|---|---|---|---|---|
| | | X | Y | |
| 0 | 0 | 962290 | 248728 | 1880 |
| 1 | 516 | 719221 | 491617 | 1784 |
| 2 | 172 | 437426 | 525121 | 1698 |
| 3 | 987 | 1175878 | 378833 | 1618 |
| 4 | 249 | 1033870 | 584487 | 1546 |
| 5 | 445 | 1040500 | 603754 | 1488 |
| 6 | 41 | 877508 | 200488 | 1426 |
| 7 | 182 | 948781 | 584700 | 1376 |
| 8 | 971 | 1225761 | 318315 | 1330 |
| 9 | 607 | 806483 | 571104 | 1286 |
| 10 | 832 | 908401 | 13181 | 1246 |
| 11 | 109 | 822899 | 302069 | 1206 |
| 12 | 99 | 665970 | 251713 | 1170 |
| 13 | 945 | 1163191 | 354381 | 1142 |
| 14 | 21 | 1410441 | 130233 | 1114 |
| 15 | 183 | 1025990 | 42609 | 1084 |
| 16 | 30 | 235574 | 811518 | 1058 |
| 17 | 39 | 354611 | 521627 | 1030 |
| 18 | 909 | 644590 | 703341 | 1008 |
| 19 | 3 | 1170029 | 239227 | 986 |
| 20 | 449 | 357430 | 604928 | 968 |
| ο | ο | ο | ο | ο |
| ο | ο | ο | ο | ο |
| ο | ο | ο | ο | ο |

APPARATUS AND METHOD FOR ESTIMATING CHIP YIELD

FIELD OF THE INVENTION

Our invention pertains to a device and method for estimating the yield during the manufacture of semiconductor chips.

BACKGROUND OF THE INVENTION

One main cause of defectively manufactured semiconductor chips (hereafter also "IC chips") are circuit defects locally generated by airborne foreign particles that adhered to the chip surface during manufacture. If mask data indicating when the particle adhered and the size/position of the adhered particle can be specified, the generation location of the defect can be specified and the yield of the semiconductor chip can be calculated.

However, the grain size distribution of the particles at the actual manufacturing environment varies. Even if the probability distribution of grain sizes can be obtained, it is difficult to determine the virtual position at which the particles adhere on the mask. Due to further uncertainties in the manufacturing process and the human element, it is difficult to determine the relationship between a particular particle distribution and the positions of defects it causes in an IC chip during manufacture.

A conventional method for estimating the yield of semiconductor chips is disclosed in Japanese Laid Open Patent Application Pub. 40376/73. Defects of a selectable shape are randomly disposed on a layout of a semiconductor chip according to a predetermined grain size distribution, and the number of defects found in critical areas of the layout are counted to obtain the probability that a defect adhering to a semiconductor chip will make the chip defective.

Then the yield is estimated by randomly disposing noise particles of a predetermined grain size distribution associated with a particular manufacturing environment on a pattern (virtual wafer) on which several identical masks are virtually arranged. The ratio of the estimated number of masks without a defect to all the masks is used as an estimate of the chip yield.

Figure 7:
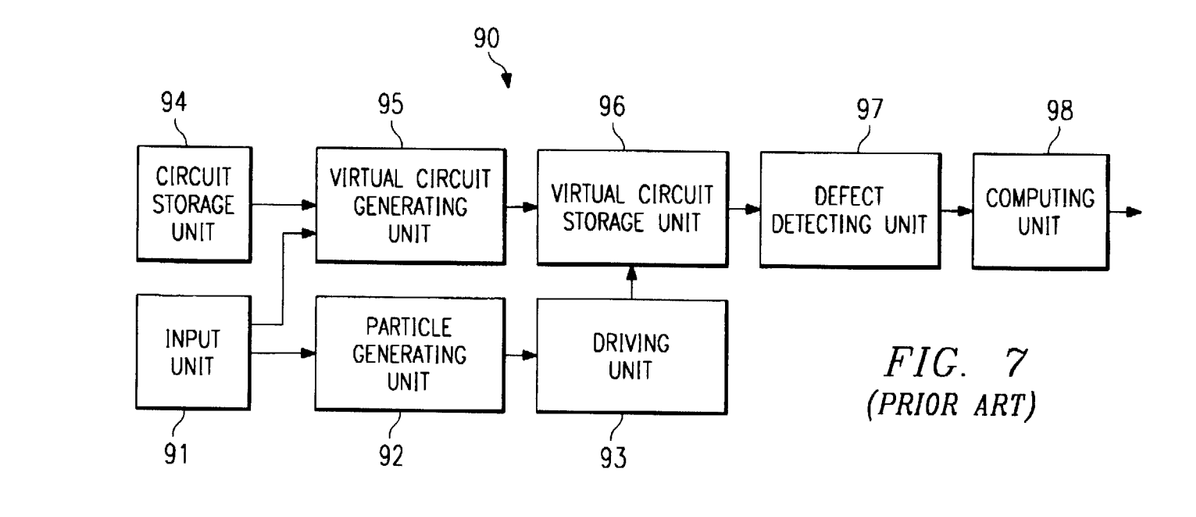
FIG. 7 is block diagram of a conventional yield estimating device.

A conventional device 90 for estimating the yield of semiconductor chips by this method is shown in FIG. 7. It has an input unit 91, a particle generating unit 92, a driving unit 93, a circuit storage unit 94, a virtual circuit generating unit 95, a virtual circuit storage unit 96, a defect detecting unit 97, and a computing unit 98.

Input unit 91 provides circuit data representing a virtual circuit and particle data about the airborne foreign particles at the manufacturing site to be simulated as noise particles. Based on the input virtual circuit data and the arrangement of semiconductor chips on the wafer, circuit generating unit 95 retrieves mask data from circuit storage unit 94 a specified number of times for specified locations to generate a pattern (virtual wafer) formed from a multiple arrangement of virtually the same mask, which wafer pattern is stored in virtual circuit storage unit 96.

Using the noise particle data of the manufacturing site from input unit 91, particle generating unit 92 generates noise particles having the same size distribution, and driving unit 93 randomly disposes the particles on the wafer's pattern data stored in virtual circuit storage unit 96.

Next, defect detecting unit 97 successively scans the particle-covered data for each mask of the wafer pattern stored in virtual circuit storage unit 96 and determines (i) whether any randomly-disposed noise particles exist on the mask data. Whereever particles exist, defect detecting unit 97 determines whether they have made the mask's circuit pattern defective. Computing unit 98 counts the number of masks that unit 97 finds without defects and computes the ratio of non-defective masks to all masks for output as a yield estimate.

Since it reflects the condition of the noise particles at the manufacturing site, the yield estimated by this device is close to the actual yield realized during manufacture. Moreover, the estimate can be arrived at by repeatedly executing the same process for each mask of the wafer in turn.

However, the successive scans of the mask data and checking for particles on the mask data and whether they make the circuit pattern defective, is time-consuming because the mask pattern requires considerable data.

To virtually arrange the various mask data so that statistical processing is possible and to check the defects by executing the scanning with all the many mask data required not only scanning time for each mask but also required developing the data of the mask pattern into a hierarchy for data of each mask, thus even more processing time was necessary.

Because storage for a large volume of mask data is required, a practical estimating device cannot be created.

Moreover, when preprocessing is used to simplify the mask data to reduce processing time and required storage area, the estimated yield becomes less accurate.

Therefore, an object of our invention is to provide an accurate, high speed yield estimating device and method that can quickly produce an accurate yield estimate from wafer pattern and particle data with reduced data storage and calculation resources.

SUMMARY OF THE INVENTION

Our yield estimating device uses a virtual pattern data (wafer) arranged with several identical masks representing a number of semiconductor chip. Statistical processing similar to that using all of these masks is made possible by analyzing the defects with reference to only one mask by corresponding the noise particles that adhere to each of the number of semiconductor chips with respect to data of one mask. Using such virtual pattern data improves the yield estimating device by giving consideration to the fact that a large memory resource and processing time are necessary.

Even when analyzing the defects with respect to one mask, high-speed defect detection is possible by accessing the mask data based on the noise particles.

Therefore the yield estimating device for semiconductor chips of our invention estimates the yield during the manufacture of semiconductor chips and has a noise particle generating device for generating noise particles which adhere to a prescribed number of semiconductor chips based on the grain size distribution of the precalculated noise particles and gives an identification number indicating the semiconductor chip on which the pertinent noise particle adheres to each of the generated noise particles, a noise particle arranging device which arranges all of the generated noise particles on one mask, a defect detecting device which detects whether the pattern of the mask is defective for each noise particle according to the arranged noise particles, and a yield calculating device which tabulates the number of semiconductor chips with a defect based on the defect detection result for each noise particle and the semiconductor chip identification number given to each noise particle and calculates the yield of the semiconductor chip from the tabulated result.

Favorably, the defect detecting device reads only the mask data near the arranged noise particles and detects whether the pattern of the mask is defective or not.

The yield estimating method for semiconductor devices of our invention is a method for estimating the yield during the manufacture of semiconductor chips, generates noise particles which adhere to a prescribed number of semiconductor chips based on the grain size distribution of the precalculated noise particles, gives the identification number indicating the semiconductor chip on which the noise particles adheres to each of the created noise particles, arranges all of the created noise particles on one mask, detects whether the pattern of the mask is defective or not according to the arranged noise particles, tabulates the number of semiconductor chips which are defective based on the detection result and the semiconductor chip identification number given to each noise particle, and calculates the yield of the semiconductor chip based on the tabulated result.

According to the yield estimating device of our invention, noise particles which adhere to the number of semiconductor chips that can be statistically processed are generated, and after giving the identification number of the semiconductor chip to which the noise particles adhere to each of the generated noise particles, all of the noise particles are arranged on one mask. Therefore, the calculation resource, such as the memory which stores the mask pattern, etc., only needs a storage area that can accommodate one mask.

The mask pattern near the noise particle is checked based on each arranged noise particle and whether or not the noise particle will cause a defect is checked successively. If a defect is caused, on which semiconductor chip the defect is generated is detected based on the semiconductor chip identification number given to the noise particle. Then, the yield of semiconductor chips is calculated from the prescribed number of semiconductor chips and the number of semiconductor chips that are not a defective. Defect check is executed with the noise particle as the key, so processing can be executed at a high speed without waste.

BRIEF DESCRIPTION OF THE DRAWINGS

FIG. 2 shows the substrate used for the defect density test, (A) shows the basic pattern, (B) shows the typical current observed at terminal S1 and terminal S2, and (C) shows the structure of the main part of the basic pattern.

In the figures, 10 is a yield estimating device, 11 an input unit, 12 a particle generating unit, 13 a driving unit, 14 a particle data storage unit, 15 a circuit storage unit, 16 a defect detecting unit, 17 a semiconductor chip defect detecting unit, 18 a computing unit, 90 a yield estimating device, 91 an input unit, 92 a particle generating unit, 93 a driving unit, 94 a circuit storage unit, 95 a virtual circuit generating unit, 96 a virtual circuit storage unit, 97 a defect detecting unit, and 98 a computing unit.

DETAILED DESCRIPTION

Figures 1, 2A, 2B, 2C:
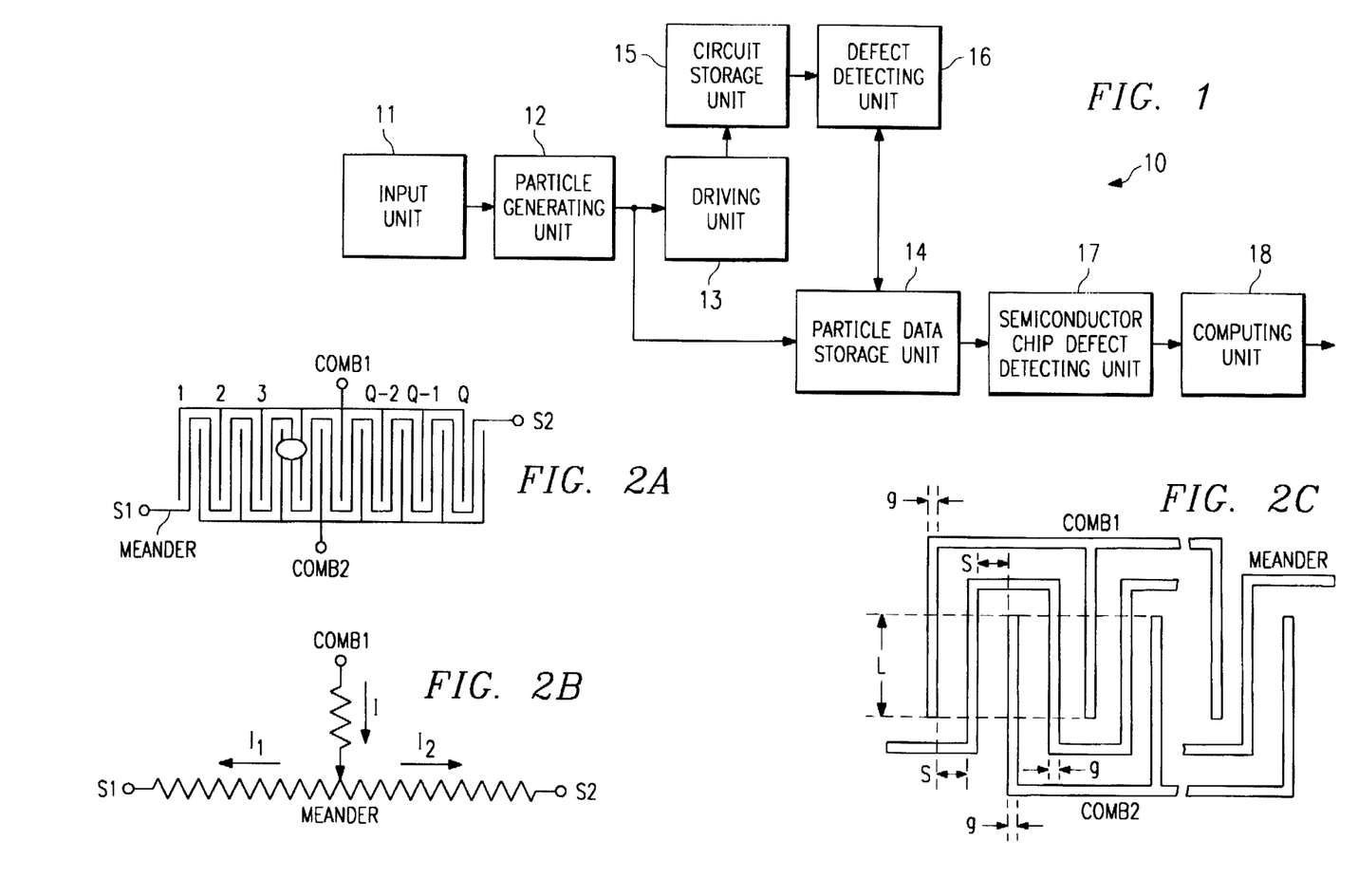
FIG. 1 is block diagram of the structure of a yield estimating device in a first embodiment of our invention.

FIG. 1 is a block diagram of a first embodiment of a yield estimating device according to our invention. It has a data input unit 11, a particle generating unit 12, a driving unit 13, a particle data storage unit 14, a circuit storage unit 15, a mask defect detecting unit 16, a chip defect detecting unit 17, and a computing unit 18.

Input unit 11 allows the user to provide the circuit data necessary for yield estimation, environmental data about the manufacturing environment, and parameters for estimating the yield. The size of the IC chip (width X and length Y) is input as circuit information. The number of noise particles $D_0$ per unit area, the grain size distribution function n of the noise particles, and the grain size limitations (smallest and largest grain sizes) are input as manufacturing environment information, together with the number of mask positions (future chips) on a virtual wafer.

The circuit pattern data is loaded in circuit storage unit 15, which is a prescribed preliminary storage device in this embodiment.

The grain diameter distribution $D(x)$ of the noise particles at the manufacturing site is obtained beforehand using a defect density checking pattern in which a basic pattern like that shown in FIG. 2(A) is laid out. In FIG. 2(A) two comb-shaped circuit patterns COMB1 and COMB2 and a meandering circuit pattern MEANDER are wired as the circuit pattern, and circuit patterns COMB1 and COMB2 are used as a pair of electric power source terminals.

When a noise particle adheres on the basic pattern, the length of the wiring from both terminals S1 and S2 of circuit pattern MEANDER to terminals COMB1 and COMB2 changes an amount which depends on the particle's position, and correspondingly changed currents I1, I2 at terminals S1 and S2 can be measured. The flow of the current is shown in FIG. 2(B), where I, I1 and I2 are the respective currents flowing into COMB1 and out of terminals S1 and S2. When each tooth of comb-shaped circuit pattern COMB1 is sequentially identified by one of addresses 1–Q starting from the terminal S1 side, the address q where a noise particle adheres can be obtained from the following equation:

$$q=(I2 \cdot Q)/(I1+I2) \tag{Eq. 1}$$

where q=address of the tooth

Q=number of comb teeth

By this method, existence of noise particles of various sizes at the actual manufacturing site can be detected using at set of the various basic patterns which change the spacing of meandering circuit pattern MEANDER and comb-shaped circuit patterns COMB1 and COMB2.

Figure 3:
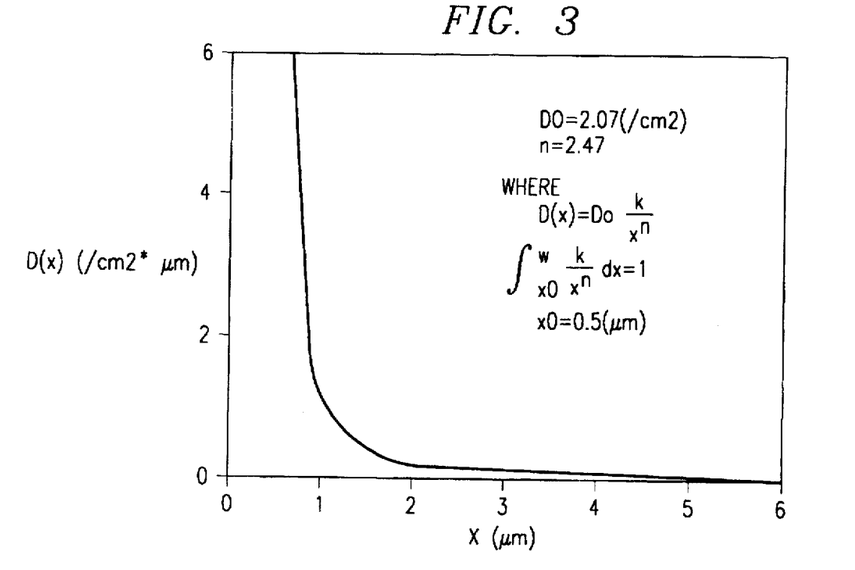
FIG. 3 shows an example of the grain size distribution of noise particles.

Then, the yield of the set of basic cone shape patterns with respect to noise particles of each size is analyzed, namely, the set of basic patterns which variously changed the spacing of COMB1, COMB2, and MEANDER. The yield equation, to be discussed later, is recursively fitted to the yield data obtained from analyzing the set of basic comb-shaped patterns to form a grain size distribution plot, such as FIG. 3. The grain size dependency, n, of the distribution function and the number of noise particles, $D_0$, per unit area, which are the parameters for determining the grain size distribution of the noise particle, are obtained from the fitted yield equation. Grain size distribution D(x) is shown in equation 2.

$$D(x)=D_0 \cdot k/x^n k=(n-1) \cdot x_0^{n-1}$$ (Eq. 2)

where $D_0$=number of noise particles per unit area n=grain size dependency x=grain size $x_0$=minimum size Yield equation Y assumes Poisson's equation $Y=\exp(-\lambda \cdot A)$ from defect density $\lambda$ and chip area A and equation 3 is used as defect density $\lambda$.

$$\lambda = D_0 \left(\frac{x_0}{s}\right)^{n-1} \cdot \frac{s(N-1)L}{n-2} \cdot \left\{ 1 - \left(\frac{N-2}{N-1}\right) \cdot \left(\frac{s}{2s+g}\right)^{n-2} \right\}$$ (Eq. 3)

where (refer to FIG. 2(C):

s=spacing between the wiring pattern $x_0$=smallest grain size n=grain size dependency L=length of overlap of COMB1 and COMB2

N=total number of wiring patterns in area L (4Q−1 in the case of FIG. 2(A))

g=width of each wiring pattern

As a result, for example, a grain size distribution function like that shown in FIG. 3 is obtained.

Particle generating unit 12 generates noise particles based on each parameter input by input unit 11. Particle generating unit 12 determines the number of particles M to be generated based on equation 4.

$$M=X \cdot Y \cdot N_0 \cdot D_0$$ (Eq. 4)

where

M=number of particles generated

X=chip width

Y=chip height $N_0$=number of masks $D_0$=number of noise particles per unit area The size of the noise particles is then determined from the grain size distribution curve shown in FIG. 3 for only the number of particles. The number of noise particles that adhere to the chip and the position within the chip on which the particles adhere are determined with a random number. The generated noise particles are stored in particle data storage unit 14 at the same time they are output to driving unit 13.

Figure 4:
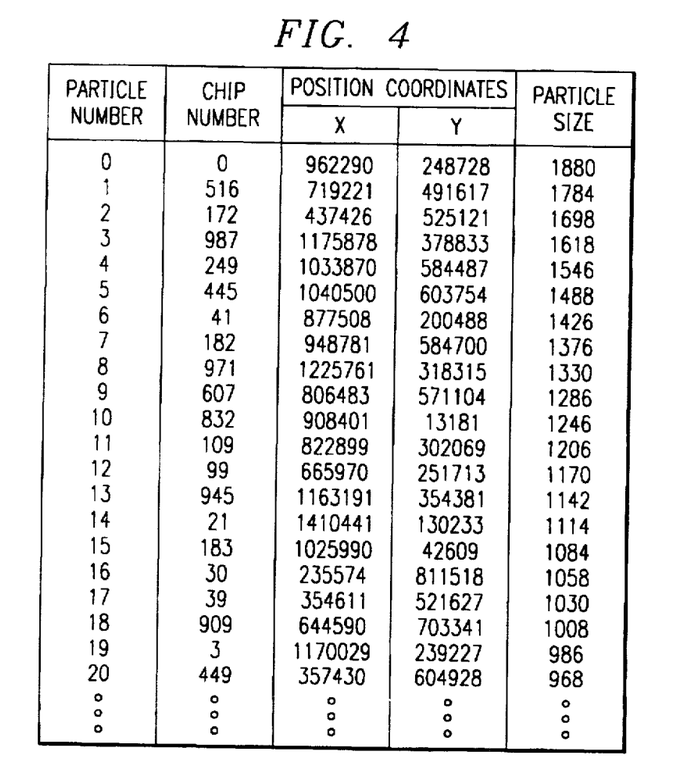
FIG. 4 shows an example of the data stored in a particle data storage unit in the yield estimating device of FIG. 1.

Particle data storage unit 14 is a storage device which stores the data of each particle generated by the particle generating unit 12 and is composed of a memory. An example of particle data stored in particle data storage unit 14 is shown in FIG. 4.

Circuit storage unit 15 is a storage device which stores the mask pattern of the semiconductor chip of which the yield is to be obtained. As circuit storage unit 15, a storage device, such as a specific memory, can be prepared. Alternatively, a prescribed area within a storage device for computing unit 18 can be set aside as circuit storage unit 15.

Driving unit 13 arranges and writes data of each particle generated by particle generating unit 12 on the mask pattern data stored in circuit storage unit 15.

Defect detecting unit 16 checks the mask pattern data on which a noise particle adheres stored in circuit storage unit 15 based on the noise particle data stored in particle data storage unit 14 and checks whether or not the noise particle creates a defect. If a defect is created, a flag indicating that a defect is created is raised in the data for each noise particle in particle data storage unit 14.

Figure 5A:
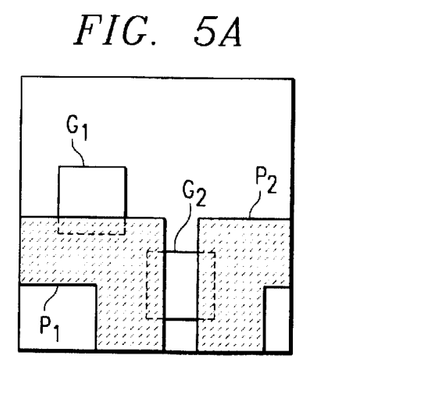
FIG. 5 shows examples of defects caused by noise particles; (A) is a short circuit and (B) and (C) show disconnections.

The defect is detected as follows either as a short circuit or disconnection of the wiring. First when the noise particle contacts two or more wiring patterns, the noise particle is detected as short circuiting the wiring patterns. For example, noise particle G2 shown in FIG. 5(A) contacts both wiring pattern P1 and pattern P2, so this noise particle G2 is considered as causing a defect. Noise particle G1 in FIG. 5(A) contacts only wiring pattern P1 so the wiring pattern is not short-circuited and does not constitute a defect.

Figure 5B:
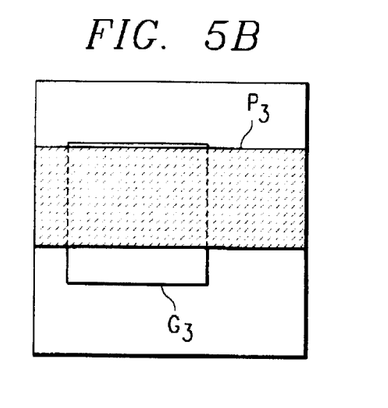
Figure 5C:
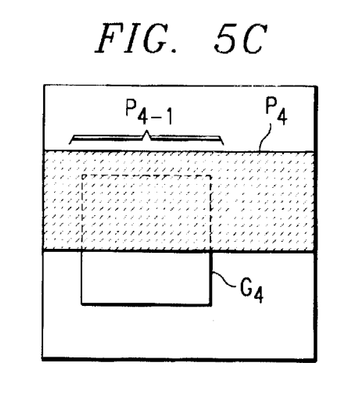

With regard to disconnection of a wiring, when a noise particle crosses the wiring pattern, a disconnection of the wiring pattern is considered to be generated. For example, as shown in FIG. 5(B), when noise particle G3 adheres to wiring pattern P3 across it, wiring pattern P3 is considered as having been disconnected and noise particle G3 is considered to have caused a defect and is indicated with a flag. In FIG. 5(B), noise pattern G3 completely crosses wiring pattern P3, but even in a case the noise particle does not completely cross the wiring pattern, noise particle G4 contacts one part of wiring pattern (P4), and the width of wiring pattern P4 (specifically the P4–1 part in FIG. 5(C)) in the part the noise particle G4 makes contact is narrower than a prescribed width (e.g., ½) as shown in FIG. 5(C), wiring pattern P4 is considered as having been disconnected.

Semiconductor chip defect detecting unit 17 successively scans the data for each noise particle stored in particle data storage unit 14 and determines whether the noise particle causes a defect in the mask pattern. Then, the mask number arranged with the noise particle that causes the defect is detected and a flag indicating that a defect was created in the mask is given to the flag storage area prepared for each mask within semiconductor chip defect detecting unit 17. When the process is executed with respect to all noise particles, the flag storage area is scanned successively, the number of masks with a defect is counted, then output to computing unit 18 along with the total number of masks.

Computing unit 18 calculates and outputs the yield from the total number of masks and number of masks with a defect input from semiconductor chip defect detecting unit 17.

The operation for estimating the yield in the yield estimating device with the structure will be explained.

First, the mask pattern data is stored in circuit storage unit 15 and the data of the mask and data of the manufacturing site are input by input unit 11. A noise particle which will probably adhere to the semiconductor chip is generated in particle generating unit 12 based on the input data. The data of the generated noise particle is output to driving unit 13 along with being stored in particle data storage unit 14. In driving unit 13, the data of the noise particle is actually arranged on the mask data stored in circuit storage unit 15. When the arrangement is completed, whether a defect has been generated in the mask pattern by the noise particle or not is checked for each noise particle in defect detecting unit 16. When a defect has been generated, a flag is given to the data of each particle stored in particle data storage unit 14.

Next, data stored in particle data storage unit 14 is successively scanned in semiconductor chip defect detecting unit 17, and if a noise particle which generates a defect exists, which semiconductor chip is defective is checked based on the semiconductor chip identification number given to the noise particle and a flag is given to the storage area prepared for each semiconductor chip. Then, the flag given for each semiconductor chip is checked, the overall number of semiconductor chips and the number of semiconductor chips with a defect are output to computing unit 18, and the yield is calculated in computing unit 18.

As noted above, according to the yield estimating device of this embodiment, the noise particles generated with respect to a number of semiconductor chips are arranged on one mask pattern, whether there is a defect in the mask pattern is detected, and if a defect is generated, which semiconductor chip is defective is checked based on the semiconductor chip identification number given to each noise particle, then the yield is calculated.

Therefore, the process which was executed with respect to a number of mask patterns can be executed with a process with respect to one mask pattern. As a result, the storage area for storing the mask pattern can correspond to one mask pattern and the processing time is about the same as that required to process one mask pattern. Normally, a semiconductor chip is manufactured using a number of masks, thus whether a defect is generated or not is determined by the noise particles with respect to the masks.

Our invention is not limited to the embodiment and various revisions are possible.

Figure 6:
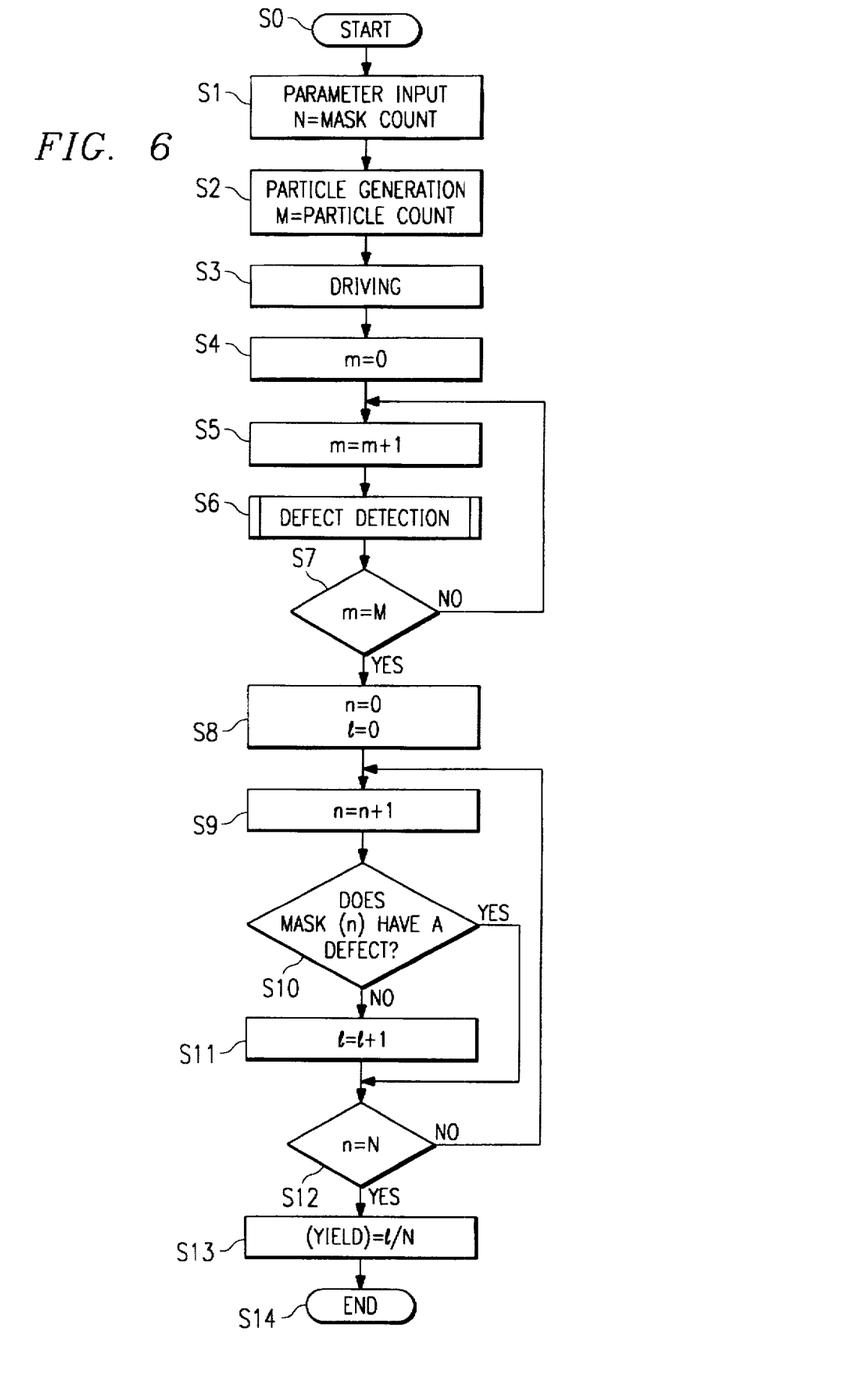
FIG. 6 is a flow chart that can be used, for example, when the yield estimating device is realized with a computer.

For example, a yield estimating device which constituted each structureal part with dedicated devices was shown as the embodiment, but this yield estimating device can be realized in a general-use computer with a storage device and a microprocessor. A flow chart of a program which controls the microprocessor in such a case is shown in FIG. 6.

The flow in the process when estimation of the yield was executed in a computer will be explained with reference to FIG. 6.

First, after the processing starts (Step S0), the data of the mask, condition of the manufacturing site, and parameters for the yield estimation are input (Step S1). Next, M noise particles are generated (Step S2) based on the parameters and successively arranged on the mask data (Step S3).

Next, whether or not the noise particles cause a defect in the mask pattern is determined (Step S6) for each noise particle (Steps S4–S7). This defect detection is executed by the aforementioned method which checks for short circuits and disconnections, and a flag is raised for noise particles that cause a defect. When defect detection has been executed for all M noise particles (Step S7), each of the N semiconductor chips is checked for defects (Steps S8–S12), and then the number 1 of semiconductor chips without defects is counted (Step S11).

Then, after the existence of a defect is determined for all semiconductor chips (Step S12), the yield is calculated based on the total number of semiconductor chips and that number of semiconductor chips without a defect (Step S13) and the processing is ended.

In this way, according to the method using the yield estimating device of our invention, estimation of the yield is possible if storage area corresponding to one mask pattern can be secured so the yield can be estimated even when a general-purpose computer is used.

Even in the application of our invention it is possible to carry out additional processings according to the condition of the noise particles, mask pattern, etc.

For example, in the embodiment, there are cases when the noise particles are superimposed when a number of noise particles are arranged on one mask. It is possible to add a separate process for detecting superimposition in such a case. In this case, separate the noise particles into a number of groups without mutual superimposition by detecting the superimposition, drive (arrange) the noise particles for each group, and execute the defect detection process. By doing so, detection of defects can be executed using the same process as in the embodiment without giving consideration to superimposition in the processing for each group. Even in this case, executing a number of processings for each group requires a shorter processing time than when executing the processing using data for a number of masks so it does not influence the effect of our invention.

According to the yield estimating device of our invention, the noise particles which may adhere to the semiconductor chip are arranged on one mask after an the identification number indicating the semiconductor chip is given to them, defects are detected based on each of the arranged noise particles, which semiconductor chip on which a defect was caused is detected, and the yield is calculated. As a result, the calculation resource, such as the storage area, etc., can be minimized considerably compared to estimating the yield using virtual mask data which suitably arranged a number of masks. Yield estimation can be executed by simply reading data of one mask, developing, and checking the defect so the processing speed can be noticeably shortened.

Therefore, it is possible to provide a yield estimating device that can realize a small calculation resource and high-speed processing.

We claim:

1. A device for computing an estimate of nondefective chip yield during manufacture of semiconductor chips, comprising:

an initializing circuit for receiving input parameters defining a layout of N semiconductor chips on a virtual wafer;

a noise particle generator for generating simulated noise particles of a predetermined grain size distribution;

a determining circuit for determining which noise particles adhere to the chips;

a labeling circuit for assigning to each noise particle which adheres to one of the chips an identification number indicating the chip to which that noise particle adheres;

a noise particle arranger for arranging all the noise particles on one corresponding chip mask having a pattern prescribed by a set of mask data;

a defect detector for detecting for each noise particle on the mask whether it makes the mask's pattern defective; and a yield calculator, responsive to the noise particles and the defect detector, for tabulating a corresponding number of defective semiconductor chips and then computing the nondefective chip yield.

2. The device of claim 1 wherein the defect detector reads only the mask data near the arranged noise particles for detecting whether the mask's pattern is made defective.

3. A method for estimating nondefective chip yield during manufacture of semiconductor chips, comprising:

predetermining a noise particle size distribution function representative of a selected semiconductor manufacturing site;

providing circuit data and device parameters for a set of semiconductor chips;

generating random simulated noise particles corresponding to the predetermined noise particle size distribution;

assigning each noise particle an identification number indicating a chip within the set of semiconductor chips to which that noise particle is associated;

disposing all the noise particles on one corresponding chip mask having a pattern prescribed by a set of mask data;

detecting for each noise particle on the mask whether it makes the mask's pattern defective and generating a corresponding defect signal; and responsive to the noise particles and the defect signal, tabulating a corresponding number of defective semiconductor chips and then computing the nondefective chip yield.

4. The method of claim 3, wherein the step of predetermining further comprises:

manufacturing a set of semiconductor test chips at the selected manufacturing site, the set of semiconductor chips having a set of defect density checking patterns;

analyzing a yield of the set of semiconductor test chips to determine a defect rate corresponding to a noise particle size; and forming the noise particle size distribution function that corresponds to the defect rate of the set of semiconductor test chips.

5. The method of claim 4, wherein the noise particle size distribution function includes a grain size dependency and a noise particle density.

6. The method of claim 5, wherein each defect density pattern has a uniform spacing between conductive signals, and wherein the set of defect density patterns have a selected number of different spacings between conductive signals.

7. The method of claim 6, wherein the step of forming the noise particle distribution function further comprises solving a yield equation representative of the defect density pattern of the set of semiconductor test chips.

8. The method of claim 7, wherein the step of forming the noise particle distribution function further comprises recursively fitting the yield equation to the defect rate corresponding to noise particle size of the set of semiconductor test chips.

9. The method of claim 3 wherein the set of semiconductor chips represent a proposed semiconductor chip that has not yet been manufactured.

* * * * *